(12) United States Patent
Kajbaf

(10) Patent No.: US 9,618,554 B2
(45) Date of Patent: Apr. 11, 2017

(54) EMISSION SOURCE MICROSCOPY FOR ELECTROMAGNETIC INTERFERENCE APPLICATIONS

(71) Applicant: AMBER PRECISION INSTRUMENTS, INC., San Jose, CA (US)

(72) Inventor: Hamed Kajbaf, Sunnyvale, CA (US)

(73) Assignee: Amber Precision Instruments, Inc., San Jose, CA (US)

(*) Notice: Subject to any disclaimer, the term of this patent is extended or adjusted under 35 U.S.C. 154(b) by 83 days.

(21) Appl. No.: 14/582,781

(22) Filed: Dec. 24, 2014

(65) Prior Publication Data

US 2015/0177301 A1    Jun. 25, 2015

Related U.S. Application Data

(60) Provisional application No. 61/920,758, filed on Dec. 25, 2013.

(51) Int. Cl.
| | |
|---|---|
| *G01R 29/08* | (2006.01) |
| *G01R 31/00* | (2006.01) |
| *G01R 35/00* | (2006.01) |
| *G01B 9/02* | (2006.01) |

(52) U.S. Cl.
CPC .................. *G01R 29/0892* (2013.01)

(58) Field of Classification Search
CPC ........ G01R 29/08; G01R 35/00; G01R 31/00; G01R 1/07; G01B 9/02
USPC ....... 324/750.02, 750.16, 612; 356/382, 487, 356/450, 485, 498
See application file for complete search history.

(56) References Cited

U.S. PATENT DOCUMENTS

| | | | |
|---|---|---|---|
| 2013/0002275 A1* | 1/2013 | Min ..................... | G01R 35/005 324/750.02 |
| 2014/0132297 A1* | 5/2014 | Hwang ................... | G01R 1/07 324/750.16 |

* cited by examiner

*Primary Examiner* — Arleen M Vazquez
*Assistant Examiner* — Neel Shah

(57) ABSTRACT

A system and method for performing radiation source analysis on a device under test (DUT) uses discrete Fourier transform on measured field components values at different sampling locations away from the DUT to derive field component values at locations on the DUT. The results of the discrete Fourier transform are multiplied by a complex phase adjustment term as a function of distance from the sampling locations to the DUT to translate the measured field component values back to the locations on the surface of the DUT.

18 Claims, 7 Drawing Sheets

EMISSION SOURCE MICROSCOPY FOR ELECTROMAGNETIC INTERFERENCE APPLICATIONS

CROSS REFERENCE TO RELATED APPLICATION

This application is entitled to the benefit of U.S. Provisional Patent Application Ser. No. 61/920,758, filed on Dec. 25, 2013, which is incorporated herein by reference.

BACKGROUND OF THE INVENTION

Finding the source of radiation is a critical step in root cause analysis of electromagnetic interference (EMI) debugging. Traditionally, near-field measurements are used to find the dominant sources of radiation on a device under test (DUT). For example, an electric field (or a magnetic field) probe could be used to measure field in the vicinity of a DUT. In this approach, different components of the DUT are usually probed to find the most dominant sources of electric field (or magnetic field) radiations. These sources are believed to be possible sources of far-field radiation. However, there are several concerns regarding the conventional near-field EMI probing and scanning such as: measurement of evanescent waves which do not contribute to far-field, mutual coupling between probe and DUT, and spatial inaccuracy of near-field probing to measure radiating field components.

SUMMARY OF THE INVENTION

A system and method for performing radiation source analysis on a device under test (DUT) uses discrete Fourier transform on measured field components values at different sampling locations away from the DUT to derive field component values at locations on the DUT. The results of the discrete Fourier transform are multiplied by a complex phase adjustment term as a function of distance from the sampling locations to the DUT to translate the measured field component values back to the locations on the surface of the DUT.

A system for performing radiation source analysis on a DUT in accordance with an embodiment of the invention comprises a probe scanning system, an electrical analyzing instrument and a processing system. The probe scanning system is configured to move a measurement probe to different sampling locations away from the DUT. The electrical analyzing instrument, which is connected to the measurement probe, is configured to measure field component values at the different sampling locations using the measurement probe. The processing system is configured to perform discrete Fourier transform on at least the measured field component values, to multiply the results of the discrete Fourier transform by a complex phase adjustment term to translate the measured field component values back to locations on a surface of the DUT, and to perform inverse discrete Fourier transform on the multiplied products to derive field component values for locations on the surface of the DUT.

A method for performing radiation source analysis on a DUT in accordance with an embodiment of the invention comprises moving a measurement probe to different sampling locations away from the DUT, measuring field component values at the different sampling locations using the measurement probe, performing discrete Fourier transform on at least the measured field component values, multiplying the results of the discrete Fourier transform by a complex phase adjustment term to translate the measured field component values back to locations on a surface of the DUT, and performing inverse discrete Fourier transform on the multiplied products to derive field component values for locations on the surface of the DUT.

Other aspects and advantages of the present invention will become apparent from the following detailed description, taken in conjunction with the accompanying drawings, illustrated by way of example of the principles of the invention.

DETAILED DESCRIPTION

It will be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment," "an embodiment," or similar language means that a particular feature, structure, or characteristic described in connection with the indicated embodiment is included in at least one embodiment of the present invention. Thus, the phrases "in one embodiment," "in an embodiment," and similar language throughout this specification may, but do not necessarily, all refer to the same embodiment.

Figure 1:
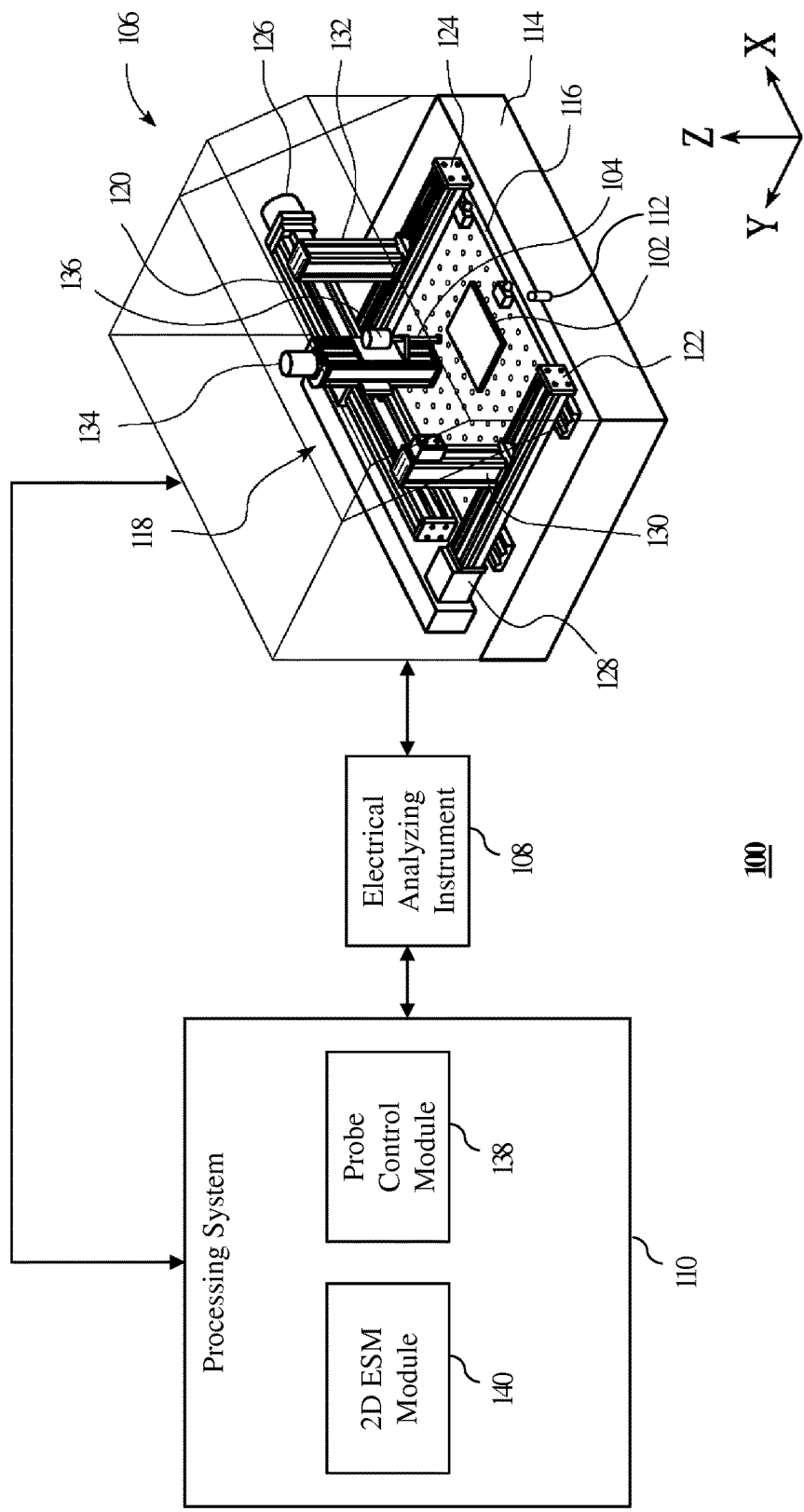
FIG. 1 is a diagram of an emission source microscopy (ESM) system in accordance with an embodiment of the invention.

With reference to FIG. 1, an emission source microscopy (ESM) system 100 for performing radiation source analysis on a device under test (DUT) 102 for electromagnetic interference (EMI) applications in accordance with an embodiment of the invention is described. The DUT can be any device that is subjected to EMI, such as an integrated circuit (IC), a printed circuit board (PCB) or any electronic device, module or system. The ESM system is designed to determine a source of radiation from the DUT for EMI applications, in particular EMI debugging. Locating a source of radiation on a DUT is a critical step in root cause analysis of EMI debugging for the DUT. As described in more detail below, the ESM system employs a technique that is similar in principle to two-dimensional (2D) synthetic aperture radar (SAR) techniques to determine a radiation source on the DUT. Once the radiation source on the DUT is found, EMI can be mitigated using known EMI mitigation methodologies.

SAR techniques are widely used to image large objects or landscapes. SAR techniques use a single antenna with relatively small physical aperture that is moved over a region to be imaged to create the effect of using a large "synthetic" antenna aperture. The SAR antenna is typically mounted to an aircraft or spaceship that travels over the target region being imaged. In operation, successive pulses of radio waves are transmitted to the target region and the echoes of these pulses are received using the same antenna. Since the antenna is moving or scanning, the radio wave pulses and the echoes are transmitted and received at different antenna locations, which creates the effect of using an antenna with large aperture. The use of the scanning antenna with large synthetic aperture allows for creation of higher resolution images than a stationary antenna with smaller physical aperture.

The ESM system 100 uses a measurement probe 104 that is scanned over the DUT 102 at various sampling locations to scan the surface of the DUT with respect to electric or magnetic fields. Similar to SAR techniques, signals from the surface being scanned are sampled at different sampling locations as the signal receiving element, i.e., the measurement probe, is moved relative to the surface being scanned, i.e., the surface of the DUT. As described in detail below, the ESM system processes these received signals to determine radiation sources on the DUT for EMI debugging.

As shown in FIG. 1, the ESM system 100 includes a probe scanning system 106, an electrical analyzing instrument 108 and a processing system 110. The probe scanning system is designed to move the measurement probe 104 so that the DUT 102, which is placed on the probe scanning system, can be scanned by the measurement probe. The electrical analyzing instrument is electrically connected to the measurement probe to receive signals from the measurement probe. The electrical analyzing instrument is also connected to a reference probe 112 to receive signals from the reference probe or to transmit signals to the reference probe, depending on the mode of operation of the ESM system. The measurement and reference probes may be configured to sense electric or magnetic field. If used to receive signals, the reference probe is positioned at a fixed location close to the DUT to receive signals from the DUT, which is in operation to emit radiations. However, if used to transmit signals, the reference probe is positioned at a fixed location in contact with the DUT to transmit signals into the DUT, which can be turned off. Using the signals received from one or both of the measurement and reference probes, the electrical analyzing instrument 108 can measure electrical or magnetic field component from the DUT at various sampling locations. The processing system processes the measured field components at the sampling locations to compute field components at corresponding locations on the surface of the DUT so that one or more radiation sources on the DUT can be determined, which can be used for EMI debugging.

The probe scanning system 106 is configured to position the measurement probe 104 to different sampling locations away from the DUT 102 so that the measurement probe can sample electric or magnetic field at the sampling locations. In an embodiment, as shown in FIG. 1, the probe scanning system includes a base 114, a scanning plate 116, a scan head 118, linear tracks 120, 122 and 124, motors 126 and 128 and connecting structures 130 and 132. The base 114 provides structural support for other components of the probe scanning system. The scanning plate 116 is attached to the base 114. The scanning plate 116 provides a surface on which the DUT 102 is placed for analysis. The scan head 118 is configured to hold the measurement probe 104 and to raise and lower the measurement probe along the Z-axis, as indicated in FIG. 1, so that the measurement probe can be positioned above the DUT at desired sampling locations. The scan head 118 is also configured to rotate the measurement probe about the Z-axis. The scan head 118 includes a motor 134 to vertically displace the measurement probe along the Z-axis and a motor 140 to rotate the probe about the Z-axis. The scan head 118 is operably connected to the linear track 120, which is aligned with the X-axis, as indicated in FIG. 1. The motor 126 is attached to the track 120 to linearly displace the scan head along the X-axis. Thus, the motor 126 controls the linear displacement of the measurement probe, which is attached to the scan head, along the X-axis. The track 120 is attached to the connecting structures 130 and 132, which are operably connected to the linear tracks 122 and 124. The linear tracks 122 and 124 are attached to the base 114 and are aligned with the Y-axis, as indicated in FIG. 1. The motor 128 is attached to the track 122 to linearly displace the connecting structures 130 and 132, the track 120 and the scan head 119 along the Y-axis. Thus, the motor 128 controls the linear displacement of the measurement probe, which is attached to the scan head 118, along the Y-axis. Consequently, the probe scanning system 106 is enabled to move the measurement probe along the X-axis, the Y-axis and the Z-axis, and to rotate the measurement probe about the Z-axis.

Figure 2:
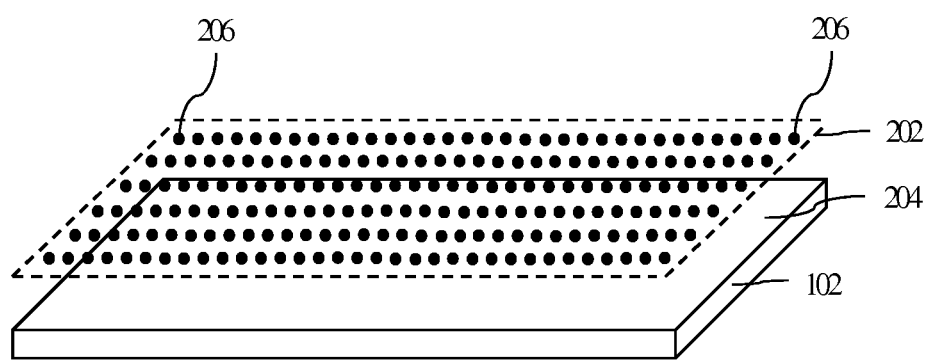
FIG. 2 illustrates a scanning plane and a source plane in accordance with an embodiment of the invention.

In operation according to some embodiments of the invention, as illustrated in FIG. 2, the probe scanning system 106 displaces the measurement probe 104 on a measurement or scanning plane 202, which is substantially parallel to a reference or source plane 204, i.e., the upper surface of the DUT 102, at a predefined distance. As used herein, the term "substantially parallel to the surface" means within +/−5% of being parallel to the surface. The distance between the scanning plane and the surface of the DUT can be any distance at which electric or magnetic fields can be detected by the measurement probe 104 at the scanning plane. As an example, this distance may be between $\lambda$ and $3\lambda$, where $\lambda$ is the wavelength of the signal of interest from the DUT. In some modes of operation, the probe scanning system 106 displaces the measurement probe so that electric or magnetic field measurements can be made uniformly on the scanning plane. As illustrated in FIG. 2, electric or magnetic field measurements can be made at various sampling locations 206 on the scanning plane that are equidistant from each other, which form a grid of sampling locations on the scanning plane. The separation distance of the sampling locations should be less than $\lambda/2$, where $\lambda$ is the wavelength of the signal of interest, so that the Nyquist spatial sampling criterion is satisfied. The operation of the probe scanning system is controlled by the processing system 110, which provides various control signals to move the measurement probe.

Figure 3:
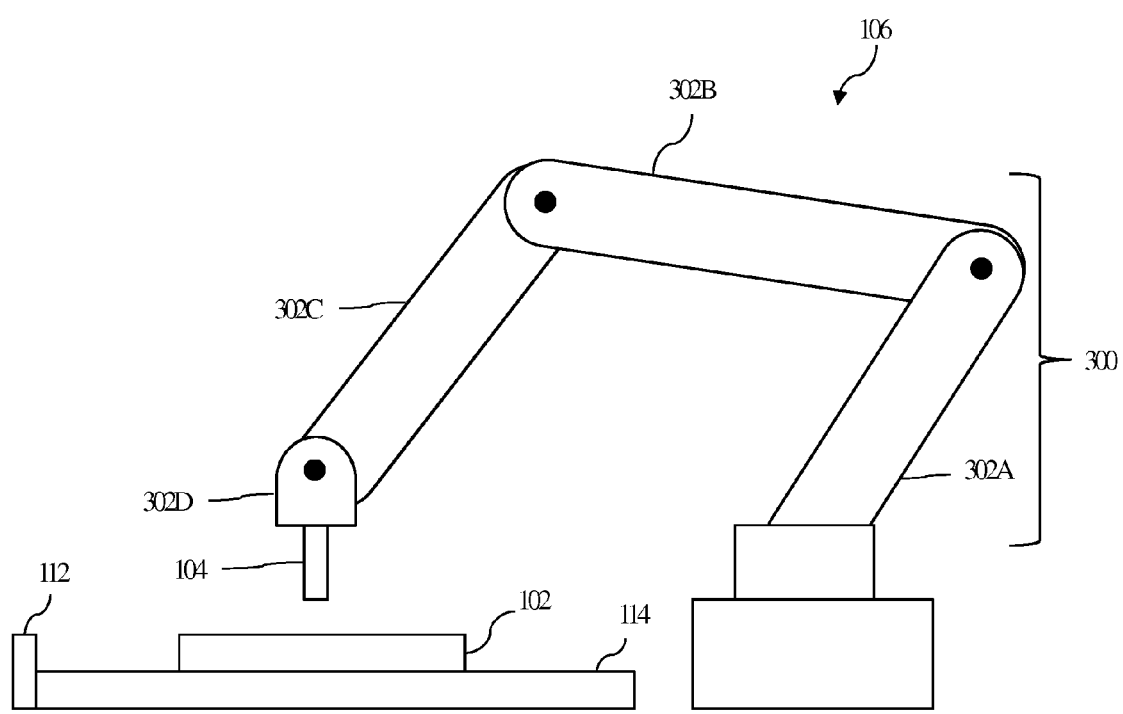
FIG. 3 is a diagram of a probe scanning system in accordance with another embodiment of the invention.

In an alternative embodiment, as illustrated in FIG. 3, the probe scanning system 106 includes a robotic arm 300 to displace and rotate the measurement probe 104 as needed. As an example, the robotic arm may have six degrees of freedom. In the illustrated embodiment, the robotic arm 300 includes sections 302A, 302B, 302C and 302D, which are connected by joints that allow rotational motion and/or translational displacement. Thus, the robotic arm 300 can move the measurement probe to the different sampling locations around the DUT 102.

The probe scanning system 106 of the ESM system 100 is not limited to the embodiments shown in FIGS. 1 and 3. The probe scanning system may use any type of a mechanical device that is able to move the measurement probe 104 to different sampling locations about the DUT 102. Furthermore, the probe scanning system may use other means than motors to move the measurement probe, e.g., an air pressure driven system.

The electrical analyzing instrument 108 is used to measure the phase and magnitude of the electric or magnetic field components at the different sampling locations about the DUT 102 using the scanned measurement probe 104 and the reference probe 112, which are connected to the electrical analyzing instrument. As noted above, the reference probe is fixed at a location, which may be at some distance from the DUT with high signal-to-noise ratio (SNR) or in physical contact with the DUT when used to receive a reference signal from the DUT or which may be in physical contact with the DUT when used to transmit a reference signal into the DUT. The electrical analyzing instrument operates to compute complex electric or magnetic component values (phase resolved) for the measured electric or magnetic field components at the sampling locations. The electrical analyzing instrument may be a radio frequency (RF) phase resolved frequency domain instrument, such as a vector network analyzer (VNA) in s-parameter mode or tuned receiver mode, or a time domain instrument, such as an oscilloscope.

The processing system 110 of the EMS system 100 is configured to control the probe scanning system 106 and to process the measurement data acquired by the electrical analyzing instrument 108 at the different sampling locations about the DUT 102 to reconstruct the field components at the DUT. The processing system includes a probe control module 138 and a two-dimensional (2D) ESM module 140. These modules may be implemented in any combination of software and hardware. In a particular embodiment, these modules are implemented as algorithms or software programs executed by one or more processors of the processing system. In some embodiments, the processing system is a computer system, such as a personal computer (PC). However, in other embodiments, the processing system may be a special-purpose computer.

The probe control module 138 is configured to control the probe scanning system 106 so that the measurement probe 104 is displaced to the different sampling locations about the DUT 102. In an embodiment, the probe control module controls the probe scanning system so that the measurement probe is displaced to the different sampling locations that are uniformly distributed in a grid system, as illustrated in FIG. 2. Thus, in this embodiment, electric or magnetic field component measurements are made at the uniformly distributed sampling locations, which may be on a scanning plane parallel to the DUT.

Figure 4:
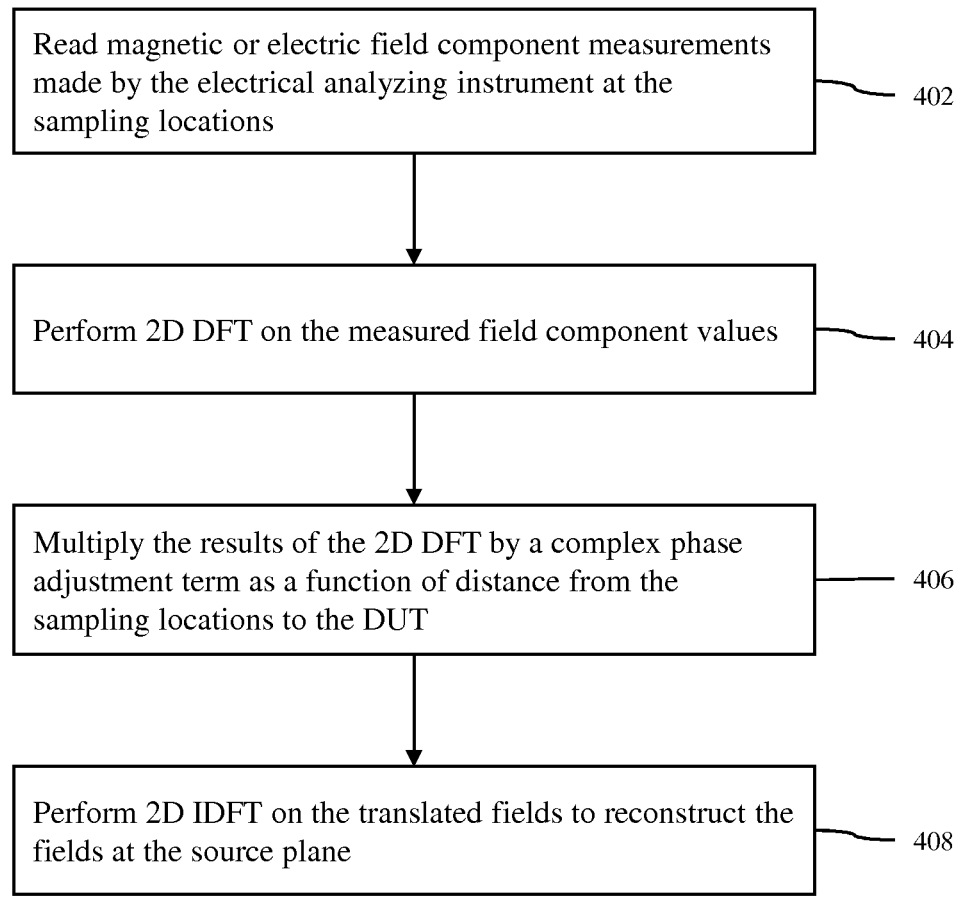
FIG. 4 is a flow diagram of a two-dimensional (2D) ESM algorithm in accordance with an embodiment of the invention.

The 2D ESM module 140 is configured to process the electric or magnetic field component measurements made at the sampling locations to derive the electric or magnetic field component values at corresponding locations on the DUT using a 2D ESM algorithm. This 2D ESM algorithm is described using the process flow diagram shown in FIG. 4. At block 402, the electric or magnetic field component measurements made by the electrical analyzing instrument at the sampling locations are read by the 2D ESM module. Each measurement is used to derive a complex value (phase resolved) electric or magnetic field at a particular sampling location defined by $(x,y,z_0)$ using the coordinate system shown in FIG. 2. This complex value (phase resolved) measured electric or magnetic field can be mathematically represented as $f(x, y, z_0, \omega_s)$, where $x$, $y$, $z_0$ are the coordinates of the sampling location and $\omega_s$ is the angular frequency of interest.

At block 404, 2D discrete Fourier transform (DFT), such as fast Fourier transform (FFT), is performed on the measured field component values to convert them to spatial spectral domain. At block 406, the results of the 2D FFT are multiplied by a complex phase adjustment term as a function of distance from the sampling locations to the DUT, which can be expressed as $e^{-jk_z(z_t-z_0)}$, where $j$ is the imaginary unit and $k_z = \sqrt{k^2 - k_x^2 - k_y^2}$. The terms, $k$, $k_x$, $k_y$, and $k_z$, are the wavenumbers, where $k=2\pi/\lambda$, and are related by the planar electromagnetic wave dispersion relation.

At block 408, 2D inverse discrete Fourier transform (IDFT), such as inverse FFT, is performed on the translated fields to reconstruct the fields at the source plane. The reconstructed complex value (phase resolved) measured electric or magnetic field can be mathematically represented as $s(x, y, z_t, \omega_s)$, where $x$, $y$, $z_t$ are the coordinates of a reconstructed location and $\omega_s$ is the angular frequency of interest.

The results of the ESM algorithm can be visually displayed on a display device or monitor (not shown) of the processing system 110. For example, a 2D visualization of the fields at the surface of the DUT 102 may be displayed on the displace device or monitor, which allows a user to readily determine where source or sources of radiation are located on the DUT.

In alternative embodiments, to decrease the overall scanning time, a random or nonuniform sampling may be used in the ESM system to reduce the number of electric or magnetic field samples. The scanning pattern used in these alternative embodiments could follow a uniform random distribution or an adaptive nonuniform pattern. Mathematical algorithms such as compressed sensing (CS) or adaptive nonuniform mesh sampling could be exploited to reconstruct the field from random or nonuniform sampled data.

Figure 5:
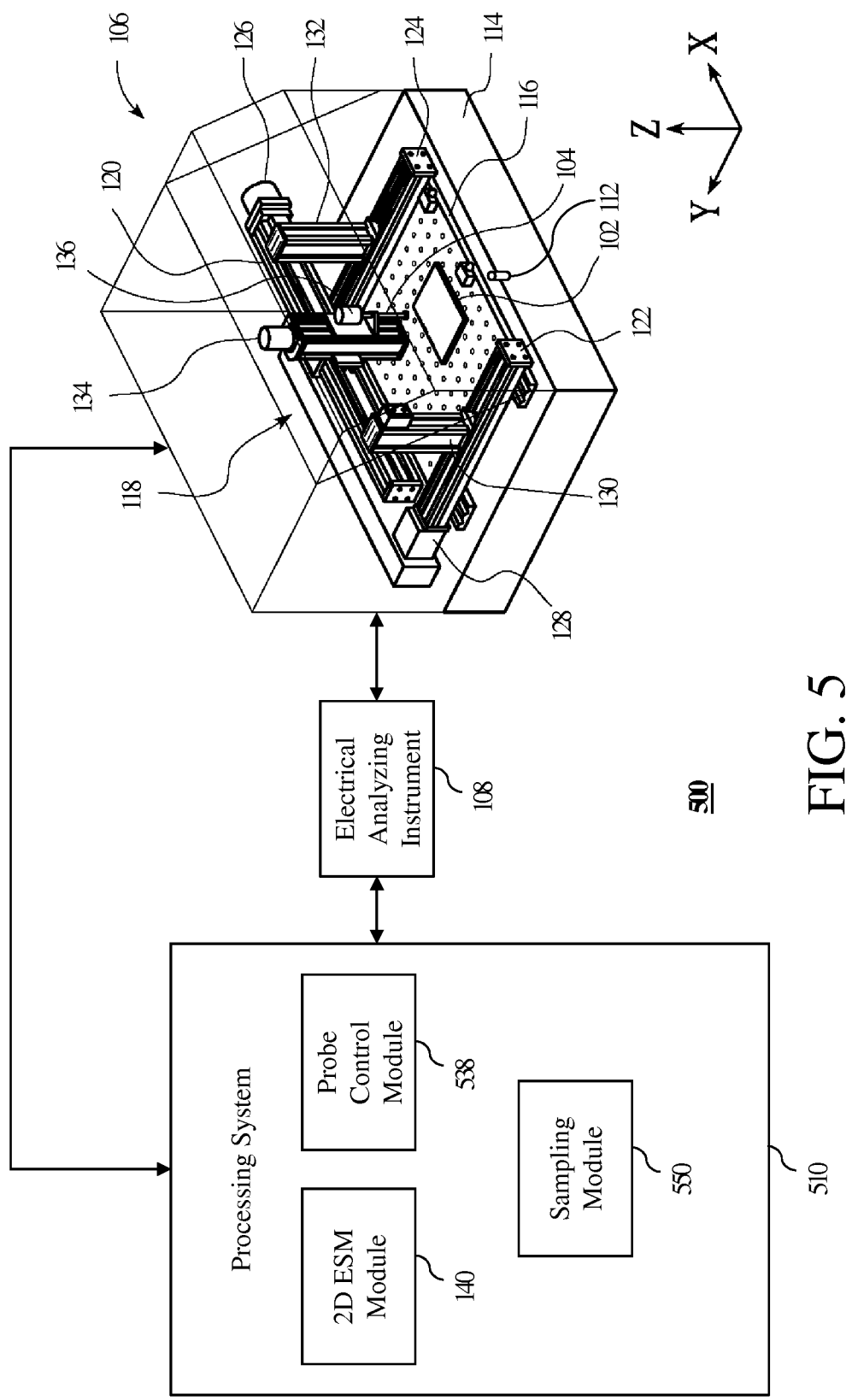
FIG. 5 is a diagram of an ESM system in accordance with an alternative embodiment of the invention.

Turning now to FIG. 5, an ESM system 500 in accordance with an alternative embodiment is shown. In FIG. 5, the same reference numbers found in FIG. 1 are used to indicate similar or same elements. As illustrated, the ESM system 500 includes the probe scanning system 106, the electrical analyzing instrument 108 and a processing system 510. The probe scanning system and the electrical analyzing instrument of the ESM system 500 are same as those of the ESM system 100. However, the probe scanning system and the electrical analyzing instrument of the ESM system 500 are used to acquire fewer electric or magnetic field component measurements than the probe scanning system and the electrical analyzing instrument of the ESM system 100. The processing system of the ESM system 500 is similar to the processing system of the ESM system 100 in that both are configured to control the probe scanning system and to process the measurement data acquired by the electrical analyzing instrument at different sampling locations about the DUT 102 to reconstruct the electric or magnetic field components at the DUT. However, since fewer electric or magnetic field component measurements are used, the processing system 510 is configured to reconstruct the electric or magnetic field components on the scanning plane from the sampled data, i.e., estimate the electric or magnetic field component values at the "missing" measurement locations on the scanning plane.

The processing system 510 includes a probe control module 538, a sampling module 550 and the 2D ESM module 140. These modules may be implemented in any combination of software and hardware. In a particular embodiment, these modules are implemented as algorithms or software programs executed by one or more processors of the processing device. In some embodiments, the processing system is a computer system, such as a personal computer (PC). However, in other embodiments, the processing system may be a special-purpose computer.

The probe control module 538 is configured to control the probe scanning system 106 so that the measurement probe 104 is displaced to the different sampling locations about the DUT 102. In this embodiment, the probe control module operates with the sampling module 550 so that the electric or magnetic field component measurements from the desired sampling locations can be made. The desired sampling locations may have a random distribution or an adaptive nonuniform pattern.

The sampling module 550 is configured to determine the desired sampling locations so that electric or magnetic field component measurements can be made at those sampling locations. Some of the sampling locations may be determined using the sampled data from other sampling locations. After all the electric or magnetic field component measurements at the sampling locations have been made, the sampling module executes a technique to reconstruct the electric or magnetic field components at other "missing" sampling locations where measurements were not actually made. The reconstruction technique may be compressed sensing (CS) technique or an adaptive nonuniform mesh sampling technique.

Figure 6:
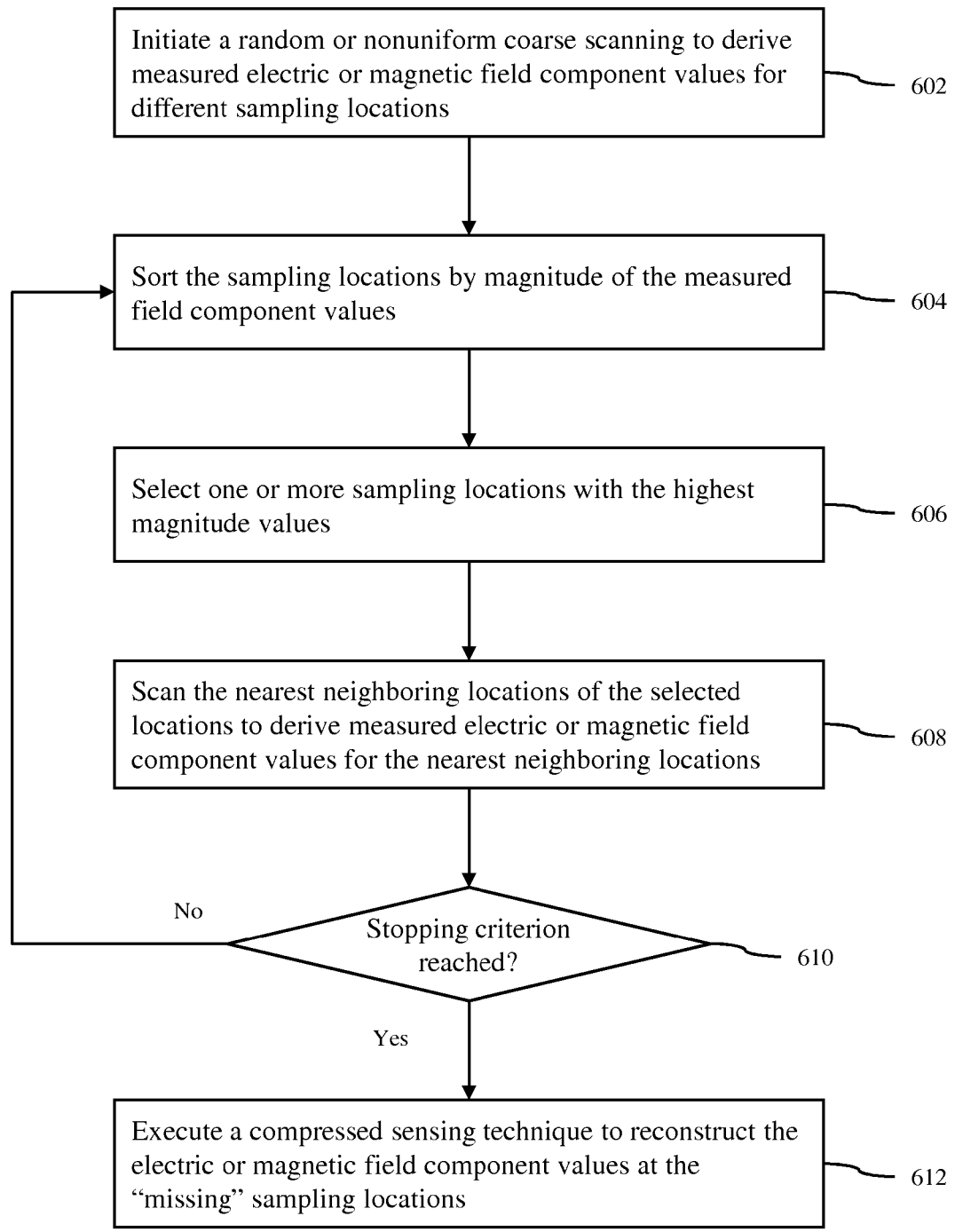
FIG. 6 is a process flow diagram of the operation of a sampling module in accordance with a particular embodiment of the invention.

The operation of the sampling module 550 in accordance with a particular embodiment of the invention is described with reference to the process flow diagram of FIG. 6. At block 602, a random or nonuniform coarse scanning is initiated to derive measured electric or magnetic field component values for different sampling locations. At block 604, the sampling locations are sorted by magnitude of the measured field component values. At block 606, one or more sampling locations with the highest magnitude values are selected. At block 608, the nearest neighboring locations of the selected locations are scanned to derive measured field component values for the nearest neighboring locations. At block 610, a determination is made whether a stopping criterion has been reached. The stopping criterion may depend on the number iterations performed to scan nearest neighboring locations for selected measurement location(s). If the stopping criterion has not been reached, then the operations returns to block 604. If the stopping criterion has been reached, then the operation proceeds to block 612, where a compressed sensing technique is executed to reconstruct the electric or magnetic field component values at the "missing" sampling locations. In an alternative embodiment, interpolation may be used to execute an adaptive nonuniform mesh sampling technique. Other techniques may be used to reconstruct the electric or magnetic field component values at the "missing" sampling locations.

The 2D ESM module 140 is configured to process the electric or magnetic field component measurements made at the sampling locations and the reconstructed electric or magnetic field component values at the "missing" sampling locations to derive the field component values at corresponding locations on the DUT using the 2D ESM algorithm. The results of the ESM algorithm can then be visually displayed on a display device or monitor (not shown) of the processing system 510. For example, a 2D visualization of the field at the surface of the DUT may be displayed on the displace device or monitor, which allows a user to readily determine where source or sources of radiation are located on the DUT.

Figure 7:
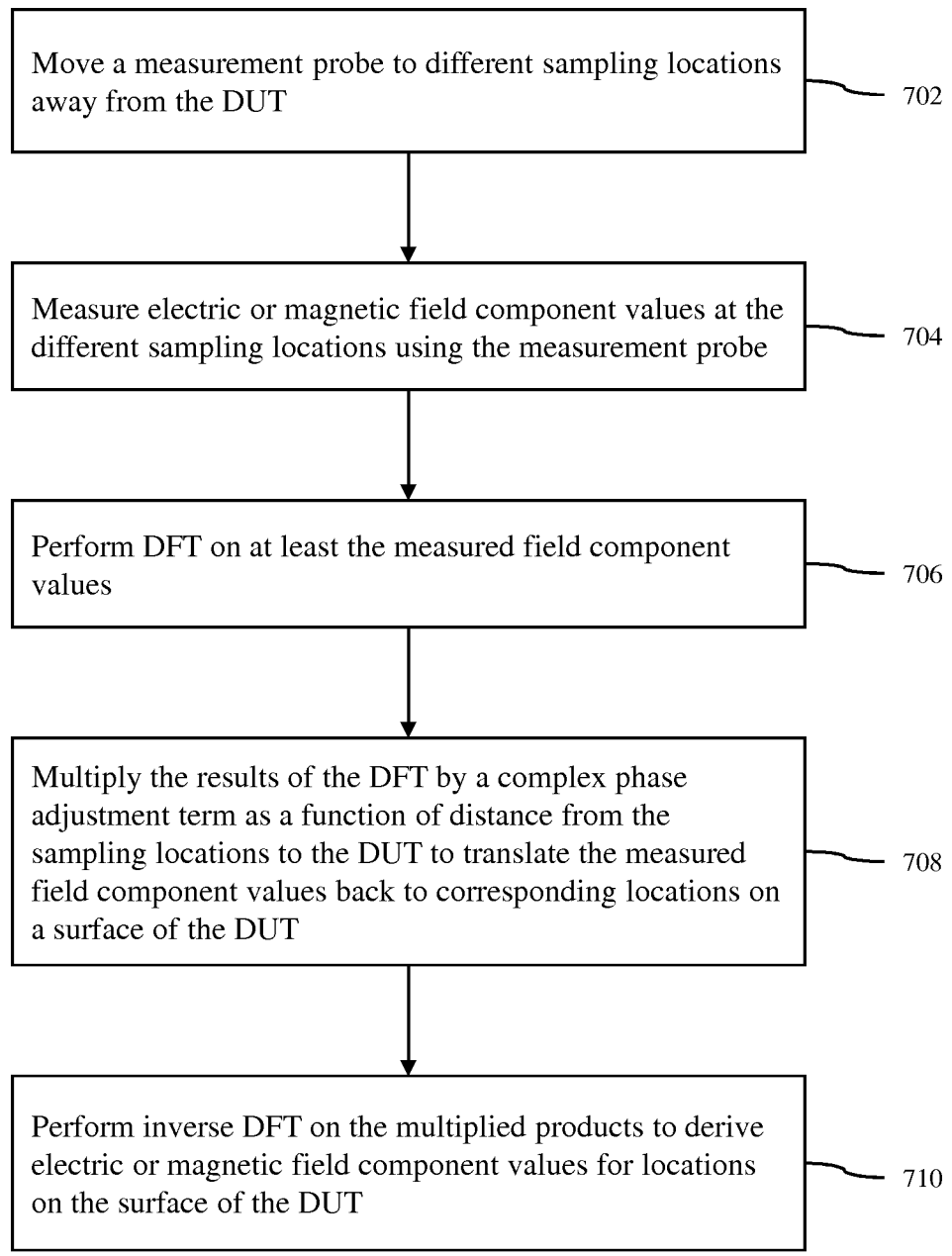
FIG. 7 is a flow diagram of a method for performing radiation source analysis on a device under test (DUT) in accordance with an embodiment of the invention.

A method for performing radiation source analysis on a device under test (DUT) in accordance with an embodiment of the invention is described with reference to a flow diagram of FIG. 7. At block 702, a measurement probe is moved to different sampling locations away from the DUT. At block 704, electric or magnetic field component values are measured at the different sampling locations using the measurement probe. At block 706, discrete Fourier transform (DFT) is performed on at least the measured field component values. At block 706, results of the discrete Fourier transform are multiplied by a complex phase term with respect to the translation direction to translate the measured field component values back to corresponding locations on a surface of the DUT. At block 708, inverse discrete Fourier transform (IDFT) is performed on the multiplied products to derive electric or magnetic field component values for locations on the surface of the DUT. These field component values represent the field at the surface of the DUT, which can be used to identify one or more radiation sources.

Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

It should also be noted that at least some of the operations for the methods may be implemented using software instructions stored on a computer useable storage medium for execution by a computer. As an example, an embodiment of a computer program product includes a computer useable storage medium to store a computer readable program that, when executed on a computer, causes the computer to perform operations, as described herein.

Furthermore, embodiments of at least portions of the invention can take the form of a computer program product accessible from a computer-usable or computer-readable medium providing program code for use by or in connection with a computer or any instruction execution system. For the purposes of this description, a computer-usable or computer readable medium can be any apparatus that can contain, store, communicate, propagate, or transport the program for use by or in connection with the instruction execution system, apparatus, or device.

The computer-useable or computer-readable medium can be an electronic, magnetic, optical, electromagnetic, infrared, or semiconductor system (or apparatus or device), or a propagation medium. Examples of a computer-readable medium include a semiconductor or solid state memory, magnetic tape, a removable computer diskette, a random access memory (RAM), a read-only memory (ROM), a rigid magnetic disc, and an optical disc. Current examples of optical discs include a compact disc with read only memory (CD-ROM), a compact disc with read/write (CD-R/W), a digital video disc (DVD), and a Blu-ray disc.

In the above description, specific details of various embodiments are provided. However, some embodiments may be practiced with less than all of these specific details. In other instances, certain methods, procedures, components, structures, and/or functions are described in no more detail than to enable the various embodiments of the invention, for the sake of brevity and clarity.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. A system for performing radiation source analysis on a device under test (DUT), the system comprising:
    a probe scanning system configured to move a measurement probe to different sampling locations away from the DUT;
    an electrical analyzing instrument connected to the measurement probe, the electrical analyzing instrument being configured to measure field component values at the different sampling locations using the measurement probe; and
    a processing system configured:
        to perform discrete Fourier transform on at least the measured field component values;
        to multiply the results of the discrete Fourier transform by a complex phase adjustment term as a function of distance from the sampling locations to the DUT to translate the measured field component values back to locations on a surface of the DUT; and
        to perform inverse discrete Fourier transform on the multiplied products to derive field component values for locations on the surface of the DUT.

2. The system of claim 1, wherein the electrical analyzing instrument is configured to measure complex electric or magnetic field component values at the different sampling locations using measurement probe.

3. The system of claim 1, wherein the complex phase adjustment term is mathematically expressed as $e^{-jk_z(z_t-z_0)}$, where j is the imaginary unit and $k_z$ is the wavenumber with respect to the Z axis and $z_t-z_0$ is the distance between the sampling locations and the DUT along the Z axis, which is normal to the surface of the DUT.

4. The system of claim 1, wherein the electrical analyzing instrument includes a radio frequency (RF) phase resolved frequency domain instrument.

5. The system of claim 1, wherein the electrical analyzing instrument includes a time domain instrument.

6. The system of claim 1, wherein the different sampling locations away from the DUT are located on a sampling plane that is substantially parallel to a surface of the DUT.

7. The system of claim 1, wherein the different sampling locations away from the DUT have a random distribution or a nonuniform pattern.

8. The system of claim 7, wherein the processing system is configured to execute a compressed sensing technique on the measured field component values at the different sampling locations to reconstruct field component values at other locations.

9. The system of claim 7, wherein the processing system is configured to execute an adaptive nonuniform mesh sampling technique on the measured field component values at the different sampling locations to reconstruct field component values at other locations.

10. A method for performing radiation source analysis on a device under test (DUT), the method comprising:
    using a probe scanning system to move a measurement probe of the probe scanning system to different sampling locations away from the DUT;
    using an electrical analyzing instrument to measure field component values at the different sampling locations using the measurement probe;
    performing discrete Fourier transform on at least the measured field component values;
    multiplying the results of the discrete Fourier transform a complex phase adjustment term as a function of distance from the sampling locations to the DUT to translate the measured field component values back to locations on a surface of the DUT;
    performing inverse discrete Fourier transform on the multiplied products to derive field component values for locations on the surface of the DUT, the field component values providing information to detect a radiation source of the DUT; and
    performing an electromagnetic interference (EMI) mitigation methodology based on the detected radiation source to mitigate EMI with respect to the DUT.

11. The method of claim 10, wherein the using the electrical analyzing instrument to measure the field component values at the different sampling locations includes using the electrical analyzing instrument to measure complex electric or magnetic field component values at the different sampling locations using the measurement probe.

12. The method of claim 10, wherein the complex phase term is mathematically expressed as $e^{-jk_z(z_t-z_0)}$, where j is the imaginary unit and $k_z$ is the wavenumber with respect to the Z axis and $z_t-z_0$ is the distance between the sampling locations and the DUT along the Z axis, which is normal to the surface of the DUT.

13. The method of claim 10, wherein the electrical analyzing instrument includes a radio frequency (RF) phase resolved frequency domain instrument.

14. The method of claim 10, wherein the electrical analyzing instrument includes a time domain instrument.

15. The method of claim 10, wherein the different sampling locations away from the DUT are located on a sampling plane that is substantially parallel to a surface of the DUT.

16. The method of claim 10, wherein the different sampling locations away from the DUT have a random distribution or a nonuniform pattern.

17. The method of claim 16, further comprising executing a compressed sensing technique on the measured field component values at the different sampling locations to reconstruct field component values at other locations.

18. The method of claim 16, further comprising executing an adaptive nonuniform mesh sampling technique on the measured field component values at the different sampling locations to reconstruct field component values at other locations.

* * * * *